Sept. 8, 1970 A. B. NEWTON 3,527,621

THERMOELECTRIC ASSEMBLY

Filed Oct. 13, 1964

Inventor:
Alwin B. Newton

By: Thomas B. Hunter Atty.

3,527,621

THERMOELECTRIC ASSEMBLY

Alwin B. Newton, York, Pa., assignor to Borg-Warner Corporation, Chicago, Ill., a corporation of Illinois Filed Oct. 13, 1964, Ser. No. 403,533
Int. Cl. H01v *1/30, 1/32*
U.S. Cl. 136—203 2 Claims

ABSTRACT OF THE DISCLOSURE

A modular thermoelectric heat exchange unit constructed so that conducted heat exchange elements are provided between spaced thermoelectric panels. A plurality of series connected couples are arranged in parallel strings which are thermally and electrically isolated from each other.

BACKGROUND AND SUMMARY OF THE INVENTION

This invention relates to thermoelectric units and more particularly to a thermoelectric assembly adapted for use in air-conditioning or refrigeration systems and the like.

Thermoelectric devices have been difficult to fabricate or assemble in large units so as to facilitate their use in relatively high capacity air-conditioning and refrigeration systems. One reason for this is because the modules, which include the brittle semi-conductor material and the relatively flexible sink and load side fin structure, are difficult to fabricate into a rigid, mechanically sound structure.

In order to manufacture a thermoelectric unit which has sufficient capacity to provide cooling and heating for large areas, it is obvious that numerous individual thermoelectric couples are required. In the past, thermoelectric modules, i.e. the aggregation of several couples, have been made up into a skeletal structure, with the space surrounding the semi-conductor elements being filled with an electrical insulating material, such as epoxy resins, to provide rigidity. An example of this method of fabrication is described in U.S. Pat. 3,076,051. Unfortunately, any solid material bridging the hot and cold junctions will conduct heat, thereby reducing the efficiency of operation. Other approaches to this problem include the use of foams, such as polyurethane foam, or loose insulating material, as the packing media for filling the space surrounding the thermoelectric elements. The use of these materials has cut down conductive heat transfer losses, but has not contributed much to the rigidity of the modules.

It is therefore a principal object of the invention to provide an improved thermoelectric assembly which minimizes heat transfer losses between the hot and cold junctions and can be made into a rigid, compact unit.

Additional objects and advantages will be apparent from a reading of the following detailed description taken in conjunction with the drawings wherein.

Figures 1, 3, 4:
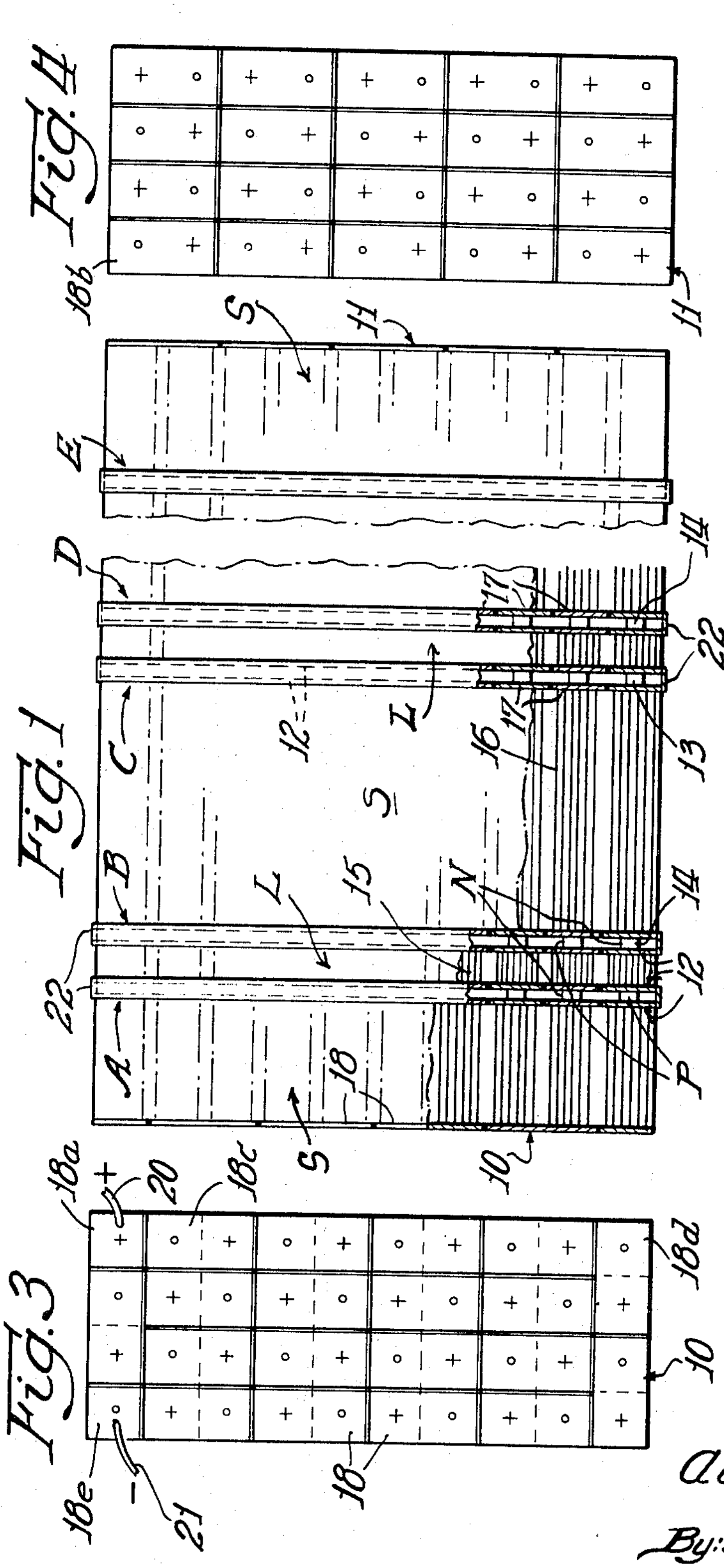
FIG. 1 is a plan view, with certain portions broken away for clarity, of a thermoelectric assembly constructed in accordance with the principles of the present invention.
FIG. 3 is a plan view of one of the end panels.
FIG. 4 is a plan view of the other end panel.
Figure 5:
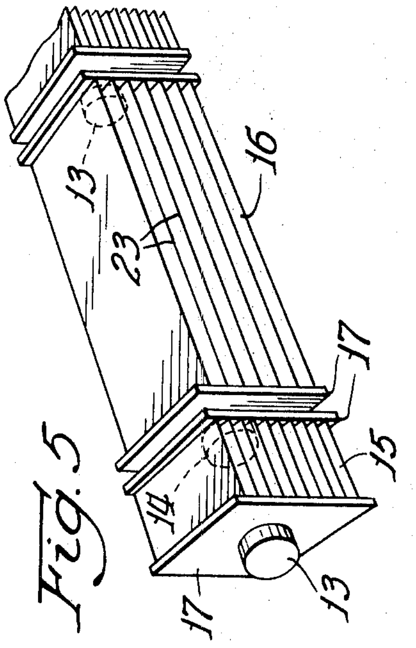
FIG. 5 is a detailed isometric view of a portion of the individual strings of thermoelectric elements.

Referring now to the drawings, the improved thermoelectric assembly described herein includes a plurality of thermoelectric panels A, B, C, D, E and end panels 10 and 11 which are spaced apart to provide a plurality of spaced heat exchange zones L and S through which the load and sink side heat exchange media are circulated in alternate fashion. The reference character L is employed to designate the load side of the unit and S the sink side, it being understood that the thermoelectric units are reversible in the sense that they have the ability to provide heating or cooling depending on the direction of current flow through the thermoelectric couples. Accordingly, the term "heat exchange zone" refers to the spaces between the panels to which heat is rejected or from which heat is abstracted as determined by the particular mode of operation. In the arrangement described herein, the sink and load side zones are arranged in an alternating pattern throughout the length of the assembly such that if a particular zone is used as a heat rejection zone, the two adjacent zones on opposite sides thereof would be heat abstraction zones. Also, while only a few panels are illustrated, it will be understood that the number of such panels is principally determined by the cooling/heating capacity required for a particular assembly and is therefore a design consideration.

Connected between the thermoelectric panels are a plurality of individual conductor-heat transfer elements 15 and 16 which are located within the heat exchange zones L and S and form extended hot and cold junctions between a P type thermoelectric element and an adjacent N type thermoelectric element, both of which are integrated into the thermoelectric panels. It will be seen that elements 15, 16 connect alternate P and N thermoelectric elements into a plurality of elongated, parallel strings of thermoelectric couples arranged in a bundle like the tubes in a tube and shell heat exchanger. For reasons which will be apparent from a later description, the conductor-heat transfer elements have a substantial surface area to promote heat exchange in relation to the fluid heat exchange media flowing between the panels in the respective exchange zones.

Each of the thermoelectric panels comprises a pair of relatively rigid sheet-like members 12 including a plurality of spaced conductor plates 17 embedded in an electrically insulating matrix, said pair of sheet-like members being arranged so that each conductor plate in one of said members forms a confronting, generally registered pair with a conductor plate in the other of said members, and a plurality of P and N type thermoelectric elements 13, 14 operatively connected to each of said plates so that they are, in effect, sandwiched between the opposing pairs of plates.

Figure 2:
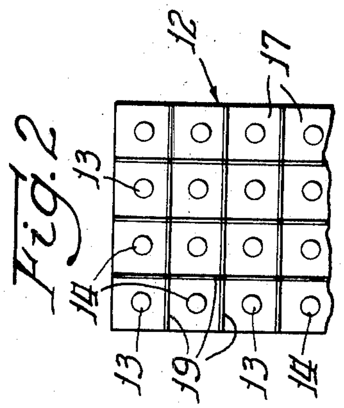
FIG. 2 is a partial plan view of one of the thermoelectric panels.

As shown most clearly in FIG. 2, the conductor plates 17 in members 12 have a flat, polygonal configuration and lie in the same plane with the opposite surfaces being exposed. The edges of the plates are separated from adjacent plates by means of an electrically insulating material 19 which provides a supporting matrix. This material, in a preferred embodiment, comprises an adhesive having good electrical insulating properties, such as any one of the well-known epoxy resin adhesives It should be pointed out that this material need not be a good thermal insulator since all of the plates in any given member are at approximately the same temperature.

The thermoelectric elements or billets in each thermoelectric panel are of alternating P and N types; for purposes of illustration, reference numeral 13 designates a P type and numeral 14 designates an N type semi-conductor material. When the assembly is put together in the manner shown in FIG. 1, the conductor-heat transfer elements 15 and 16 are soldered or otherwise mechanically or electrically joined to the plates 17 in adjacent thermoelectric panels to provide a bundle of parallel strings of thermoelectric couples, each of which is electrically isolated from an adjacent string by insulating material 19. The thermoelectric elements in panels A, B, C, D, etc. are arranged so that the conductor-heat transfer elements 15 and 16, conduct current through alternating P and N type thermoelectric elements in series.

In a preferred embodiment, each of the conductor-heat transfer elements 15 and 16 comprises a series of spaced fins 23 arranged in parallel and joined to the opposing faces of plates 17 in adjacent thermoelectric panels. In the structure shown, the shorter of the two groups, i.e. elements 15, would normally be used for attempering the air to be conditioned, while elements 16 would be arranged in the path of the sink heat exchange medium. It is obvious, however, that the length, spacing, and area of the fins may be varied to suit the requirements of any given installation as to maximum cooling/heating capacity and optimum pressure drop across the fins. Also the particular fin design is not critical; for example they may be of the pin or rod type to permit air flow in different directions. Copper is the preferred material for both the plates 17 and the conductor-heat transfer elements 15, 16, but any good electrically conductive material may be substituted as desired.

An important aspect of the invention is the use of sealing means, designated at 22, surrounding the periphery of the thermoelectric panels in sealing relation with marginal edges of the sheet-like members forming said panels. In the structure shown, this may take the form of a gas and moisture impermeable tape made from a material, such as Mylar, having good electrical insulating properties. With the tape in place, the panels are hermetically sealed, thereby preventing air from flowing around the thermoelectric elements and eliminating condensation of moisture thereon. It will be recognized that by limiting the tape solely to the periphery of the panels, the heat transfer from a hot junction to an adjacent cold junction by conduction is minimized. The air or other gas confined in the space bounded by the two sheet-like members and the sealing tape is an excellent insulator.

The end panels 10 and 11 are constructed in substantially the same manner as the sheet-like members 12 forming the thermoelectric panels, that is with an insulating material 19 providing a supporting matrix. Each of said end panels includes a plurality of electrical busses or conductor plates 18*a*, 18*b*, etc. made of copper or similar electrically conductive material which afford means for carrying the current from one string of thermoelectric couples to another of said strings. As seen in FIG. 3, cable 20, attached to one terminal of a DC power supply (not shown) is connected to the upper right-hand plate 18*a* (FIG. 3). The direction of (conventional) current flow through different strings of thermocouples is designated by the use of crosses representing flow of current into the plane of the drawing and dots representing current flow out of the plane of the drawing. Electrical current flow is thus from plate 18*a* through the upper right-hand string to plate 18*b* on panel 11, and down to the next lower string. It then flows from right to left (FIG. 1) to plate 18*c* (FIG. 3) on panel 10 and to the next lower string, and so forth. When it reaches the bottom string, it is conducted to the next adjacent row by means of jumper plate 18*d* on end panel 10. The flow of current continues in similar fashion until it eventually reaches the plate 18*e* (upper left-hand corner of FIG. 3) to which cable 21, leading to the other terminal of the DC power supply is attached.

OPERATION

The thermoelectric assembly described above is adapted to be arranged in a suitable fixture for the supply of separate streams of air or other fluid to the heat exchange zones S and L between adjacent panels in heat exchange relation with the sink and load sides, respectively, of the thermoelectric couples.

It will be understood that the sink heat exchange fluid, e.g. ambient air from outside the enclosed space, is delivered from a blower or the like, separated from individual streams by means of baffles or other suitable means, and passed through the heat exchange zones S in heat exchange relation with the sink side junctions. The air is then collected and conducted away from the assembly, eventually being discharged outside of the enclosed space. At the same time, the air to be conditioned is taken from within the enclosed space, divided into separate streams, passed through heat exchange zones L and then delivered into the enclosed spaces (or other heating/cooling load).

When the unit is to be operated on the cooling cycle, the direction of current flow through the series of thermoelectric couples is such that heat is abstracted from the air to be conditioned and pumped to the hot junctions or sink side where it is rejected by conductor-heat transfer elements 16 to the sink heat exchange fluid passing thereover. During heating operations, the current is reversed and heat is abstracted from the sink heat exchange fluid and rejected to the air to be conditioned passing over conductor heat transfer elements 15. It will be understood that if water or some other liquid is utilized as the sink heat exchange fluid, or if the load side heat exchange medium is a liquid, the fin elements may be modified to include the flow passages for such fluids.

While this invention has been described in connection with a specific embodiment thereof, it is to be understood that this is by way of illustration and not way of limitation; and the scope of this invention is defined solely by the appended claims which should be construed as broadly as the prior art will permit.

What is claimed is:

1. In a thermoelectric assembly, a plurality of thermoelectric panels arranged in spaced relation to provide a plurality of spaced heat exchange zones therebetween through which a sink side and a load side heat exchange medium are adapted to be circulated in alternate fashion, each said thermoelectric panel comprising a pair of sheet-like members having at least two spaced apart conductor plates electrically insulated from each other, said pair of sheet-like members being arranged such that the conductive plates in one said member form confronting pairs in generally registered relation with the conductive plates in the other said member, and P and N type thermoelectric elements operatively joined to and extending between said confronting pairs of conductor plates; a plurality of individual, spaced apart, conductor-heat transfer elements connected to the conductor plates in adjacent thermoelectric panels and located within said heat exchange zones, each said conductor-heat transfer element forming an extended current carrying junction between a single P type thermoelectric element in one panel and a single N type thermoelectric element in an adjacent panel, said conductor-heat transfer elements providing a bundle of series connected parallel strings of thermoelectric couples having their hot and cold junctions respectively disposed in alternate heat exchange zones; panel means associated with opposite ends of said assembly having conductor elements associated therewith, said panel means providing additional heat exchange zones between said panel means and an adjacent thermoelectric panel; and conductor-heat transfer elements connecting the terminal portions of two of said strings of thermoelectric couples of said conductor elements.

2. In a thermoelectric assembly, means providing a string of a plurality of thermoelectric couples in spaced relationship and in a single plane, each of said couples including a P-type thermoelectric element, an N-type thermoelectric element, and electrically conductive heat transfer bridges directly connecting said spaced thermoelectric couples in an electrical series circuit, a plurality of said couples being arranged as a bundle of parallel strings with at least three couples in each said string; means for supporting and electrically isolating said parallelly arranged strings so that each string is electrically isolated from each other, said means for supporting said couples including a plurality of sheet-like members, each comprising a plurality of generally flat, spaced apart conductor plates forming a part of said heat transfer bridges and embedded in a supporting matrix of electrically insulating material, and means at opposite ends of said bundle to provide a plurality of electrical connections between certain pairs of said strings, said connections being arranged such that electrical current passes through at least three strings in series.

References Cited

UNITED STATES PATENTS

| | | | |
|---|---|---|---|
| 3,040,538 | 6/1962 | Alsing | 136—212 X |
| 1,848,655 | 3/1932 | Petrik | 136—212 |
| 2,749,716 | 6/1956 | Lindenblad | 136—204 X |
| 2,949,014 | 8/1960 | Belton | 136—204 X |
| 3,076,051 | 1/1963 | Haba | 136—203 X |
| 3,035,109 | 5/1962 | Sheckler | 136—212 X |
| 3,095,709 | 7/1963 | Demand | 136—204 |
| 3,129,116 | 4/1964 | Corry | 136—204 X |
| 3,178,894 | 4/1965 | Mole et al. | 136—204 X |
| 3,178,895 | 4/1964 | Mole et al. | 136—204 X |
| 3,213,630 | 11/1965 | Mole | 136—204 X |
| 3,290,177 | 12/1966 | Mole et al. | 136—204 |

ALLEN B. CURTIS, Primary Examiner

U.S. Cl. X.R.

62—3; 136—211, 212